(12) United States Patent
Stern et al.

(10) Patent No.: US 8,613,899 B2
(45) Date of Patent: Dec. 24, 2013

(54) APPARATUS AND METHOD FOR PRODUCING FREE-STANDING MATERIALS

(75) Inventors: Heather A. G. Stern, Chelmsford, MA (US); Vincent DiFilippo, North Chelmsford, MA (US); Jitendra S. Goela, Andover, MA (US); Michael A. Pickering, North Chelmsford, MA (US); Hua Bai, Lake Jackson, TX (US); Debashis Chakraborty, Lake Jackson, TX (US); Hangyao Wang, Pearland, TX (US)

(73) Assignees: Rohm and Haas Electronic Materials LLC, Marlborough, MA (US); Dow Global Technologies LLC, Midland, MI (US)

( * ) Notice: Subject to any disclaimer, the term of this patent is extended or adjusted under 35 U.S.C. 154(b) by 31 days.

(21) Appl. No.: 13/449,126

(22) Filed: Apr. 17, 2012

(65) Prior Publication Data

US 2013/0270356 A1    Oct. 17, 2013

(51) Int. Cl.
  *B01J 19/00*    (2006.01)
  *C01B 17/00*    (2006.01)
  *C01B 19/00*    (2006.01)
  *H01L 21/00*    (2006.01)

(52) U.S. Cl.
  USPC ........... 423/508; 423/511; 422/129; 422/224; 502/524; 438/102; 252/519.4; 252/62.3 S

(58) Field of Classification Search
  USPC ........... 423/508, 511; 422/129, 224; 502/524; 438/102; 252/519.4, 62.3 S
  See application file for complete search history.

(56) References Cited

U.S. PATENT DOCUMENTS 3,714,337 A  *  1/1973  Garet .............................. 423/508
3,773,909 A  *  11/1973  Pearlman ....................... 423/508
5,523,063 A  *  6/1996  Anderson ....................... 422/224

* cited by examiner

*Primary Examiner* — Timothy Vanoy
(74) *Attorney, Agent, or Firm* — John J. Piskorski

(57) ABSTRACT

An apparatus includes a manifold with a chamber for mixing multiple reactants. Gases are jetted into the manifold by a plurality of inlet injectors. The inlet injectors are arranged such that the gases passing into the manifold impinge on each other at a common point to form a mixture. The mixture passes through a plurality of holes in one side of the manifold into a deposition chamber where the mixture of gases impinges on additional gases at a common point to provide a reaction resulting in deposition of solid materials in the deposition chamber. The solid materials are free-standing.

8 Claims, 13 Drawing Sheets

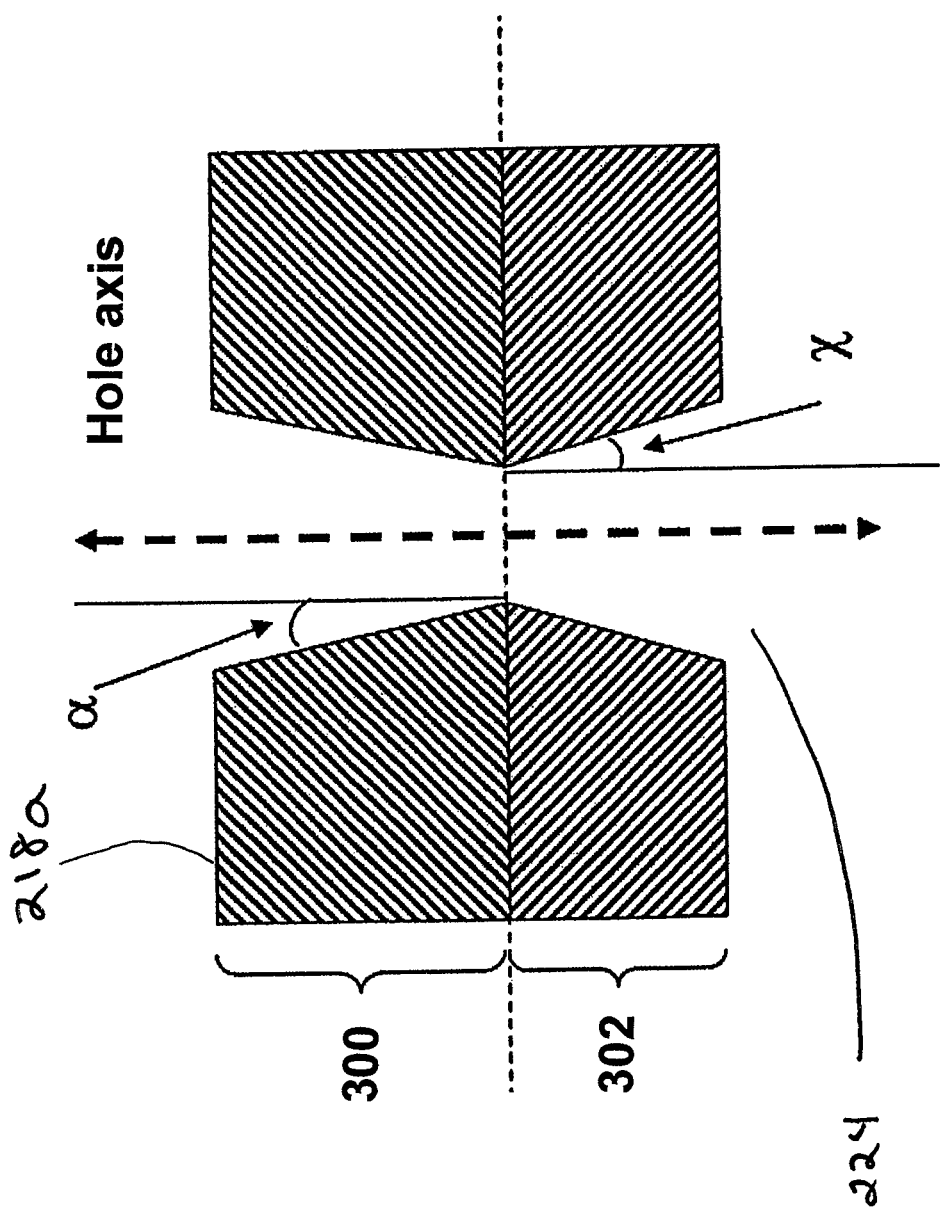

APPARATUS AND METHOD FOR PRODUCING FREE-STANDING MATERIALS

FIELD OF THE INVENTION

The present invention is directed to an apparatus and method for producing a free-standing solid material from multiple reactants. More specifically, the present invention is directed to an apparatus and method for producing a free-standing solid material from multiple reactants where substantially uniform and rapid mixing of the multiple reactants occurs and powder formation is inhibited.

BACKGROUND OF THE INVENTION

In the manufacture of free-standing solid materials by chemical vapor deposition (CVD), reactants in the form of gases are introduced into a hot furnace or deposition chamber where they react on the walls of the furnace or on the surface of a substrate or mandrel positioned in the furnace to form a solid deposit or coating thereon which when removed from the substrate or mandrel is free-standing. Typically a vacuum furnace designed in the shape of a tubular cylinder having a circular cross section is used for chemical vapor deposition. Mixing chambers are also provided which are designed to ensure that the gases and other reagents are mixed together to provide a uniform mixture. In many conventional mixing chambers the gases are injected through two or more injectors flowing in parallel or cross configuration from one wall of the mixing chamber. When the length of the mixing chamber is of the same order as the width, the gases do not have sufficient residence time in the mixing chamber before they exit into the deposition chamber. This results in a non-uniform mixing of gases.

The mixed gases are injected into the deposition chamber at relatively fast rates in order to avoid undesired powder formation due to the fast reactions between the gases. However, this causes non-uniform mixing within low aspect ratio deposition chambers and results in low deposition rates on the walls of the chambers. In the formation of spinel where chlorides and water are typical reagents, the reaction between the chlorides and water is very rapid and powder still forms regardless of the fast injection rates of the gases into the deposition chamber. Accordingly, there is a need for an apparatus and method for reducing powder formation and improving chemical vapor deposition of solid materials.

SUMMARY OF THE INVENTION

An apparatus includes a manifold including a mixing chamber, the mixing chamber includes a plurality of inlet injectors, each inlet injector includes a bore opening into the mixing chamber for the introduction of gases into the mixing chamber, the bores of the plurality of inlet injectors are angled to allow the gases entering into the mixing chamber to impinge on each other in the mixing chamber to form a substantially uniform mixture of the gases; a dispersion plate covers a side of the mixing chamber, the dispersion plate includes a plurality of holes for egress of the substantially uniform mixture of gases from the mixing chamber; and a cross-jet component joined to the manifold, the cross-jet component includes a plurality of holes for the egress of additional gases from the cross-jet component, each hole of the cross-jet component corresponds to a hole in the dispersion plate to allow the substantially uniform mixture of gases from the mixing chamber of the manifold to impinge on the additional gases from the cross-jet component.

A method includes providing a plurality of gases; jetting the plurality of gases into a mixing chamber where they impinge on each other to allow the gases to form a substantially uniform mixture; the substantially uniform mixture of gases passes from the mixing chamber into a deposition chamber; impinging the substantially uniform mixture of gases from the mixing chamber with additional gases from a cross-jet component in the deposition chamber to form a second substantially uniform mixture of gases; and reacting the second substantially uniform mixture of gases to deposit a compound.

The apparatus and method enable a substantially uniform and rapid mixing of gaseous mixtures such that the substantially uniform mixture of gases passes from the mixing chamber and into a deposition chamber where the substantially uniform mixture of gases from the mixing chamber reacts with additional gases in the deposition chamber to produce a solid compound deposit having a thickness of 0.1 mm or greater. The apparatus and method also inhibit the formation of undesirable powder in deposition chambers. The undesirable powder reduces the yield of solid compound deposit. The solid compound deposit is a free-standing material.

BRIEF DESCRIPTION OF THE DRAWINGS

FIG. 12 is a schematic sectional view of a taper hole of the plenum.

FIG. 13 is a schematic sectional view of a multiple taper hole of the plenum.

FIG. 14 is a schematic sectional view of an alternative configuration of a multiple taper hole.

DETAILED DESCRIPTION OF THE INVENTION

As used throughout this specification, the following abbreviations have the following meaning, unless the context clearly indicates otherwise: ° C.=degrees Centigrade; slpm=standard liters per minute; meters; m=meters; mm=millimeters; cm=centimeters; cc=cubic centimeters; μm=microns; CVD=chemical vapor deposition; PVD=physical vapor deposition; CFD=computational fluid dynamics; and Torr=1 mm of Hg=133.322368 pascals. The term "monolithic" means composed of one solid piece; and the term "a" or "an" may refer to the singular or plural.

All percentages are by weight unless otherwise noted. All numerical ranges are inclusive and combinable in any order, except where it is logical that such numerical ranges are constrained to add up to 100%.

A CVD apparatus includes a manifold including a mixing chamber, the mixing chamber includes a plurality of inlet injectors, each inlet injector includes a bore opening into the mixing chamber for the introduction of gases into the mixing chamber, the bores of the plurality of inlet injectors are angled to allow the gases entering into the mixing chamber to impinge on each other in the mixing chamber to form a substantially uniform mixture of the gases; a dispersion plate covers a side of the mixing chamber, the dispersion plate includes a plurality of holes for egress of the substantially uniform mixture of gases from the mixing chamber; and a cross-jet component joined to the manifold, the cross-jet component includes a plurality of holes for the egress of additional gases from the cross-jet component, each hole of the cross-jet component corresponds to a hole in the dispersion plate to allow the substantially uniform mixture of gases from the mixing chamber of the manifold to impinge on the additional gases from the cross-jet component. The plurality of holes helps distribute gas and mixtures of gas reagents evenly along the length of a deposition chamber. Preferably the plurality of holes in the dispersion plate has the same diameter. The dispersion plate with its plurality of holes provides for a total variation of mass flow of gases from 20% or less, preferably 5% or less and more preferably 1% or less where 0 is the ideal variation value. Total variation is determined by (max. flow of a gas through the holes of the dispersion chamber—min. flow of a gas through the holes of the dispersion chamber)/(average flow of gas through all of the holes of the dispersion chamber). The manifold and its components are made from materials which do not react with the gases which come in contact with the manifold and its components. Such materials include, but are not limited to, graphite, quartz and alumina.

Figure 1:
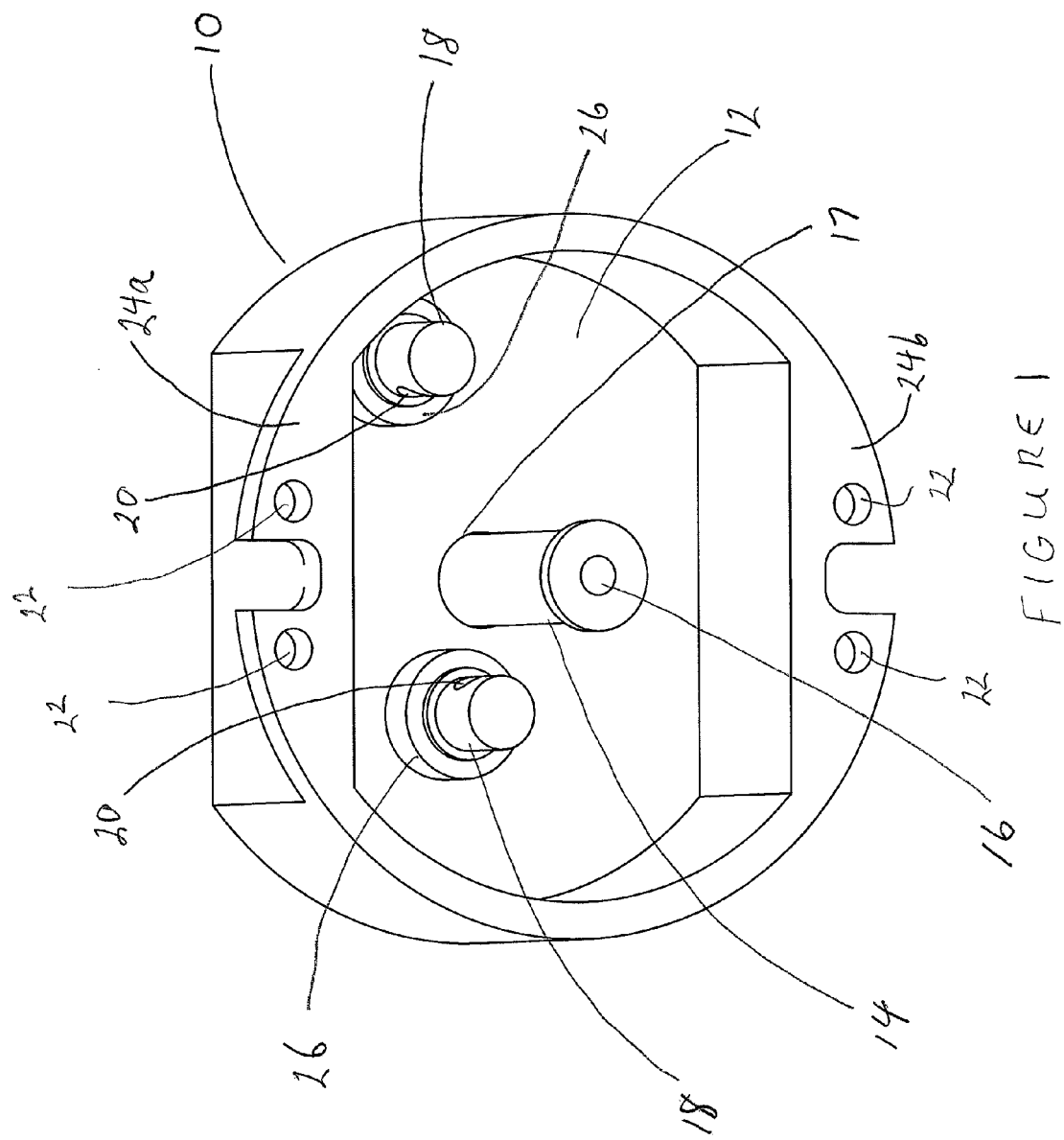
FIG. 1 is a manifold showing the interior mixing chamber with inlet injectors and a central injector.

FIG. 1 shows one embodiment of the manifold 10 showing the mixing chamber 12, as defined by six sides, a top side, bottom side, front side and back side. The top side, bottom side and back side are one piece and provide a mixing chamber where gases are substantially uniformly mixed, central injector 14 joined on the back side of the manifold with a center bore 16, the central injector passes through orifice 17 where additional gases are injected into a deposition chamber, and inlet injectors 18 which are also joined to the back side of the manifold. Each inlet injector has a bore 20 for the ingress of gases into the mixing chamber. Holes 22 on the upper and lower flanges 24a and 24b, respectively, of the manifold and which are contiguous with the upper and lower sides of the manifold are for securing the manifold to a dispersion plate using bolts or securing pegs (not shown). Each inlet injector is supported by hollow circular flanges 26 which are contiguous with the back of the manifold. Each inlet injector may rotate 360° about its central axis within its respective hollow flange for adjusting the direction of the gases jetted into the mixing chamber. In this embodiment the velocities of the gases passing into the mixing chamber are selected to provide substantially uniform mixing. Velocity ratios of gases passing into the mixing chamber are preferably 0.5 to 2, more preferably 0.75 to 1.5. Such ratios may be determined by CFD simulations which are well known in the art. The ratios may be changed by changing the internal diameter of one or more of the inlet injectors or changing the flow rate of one or more of the gases or a combination of the two. The diameters depend on the gas flow rate and the gas flow rate depends on the size of the reactor and how much reactant is needed for the chemistry of choice. Minor experimentation may be done to achieve a desired velocity ratio.

Figure 2:
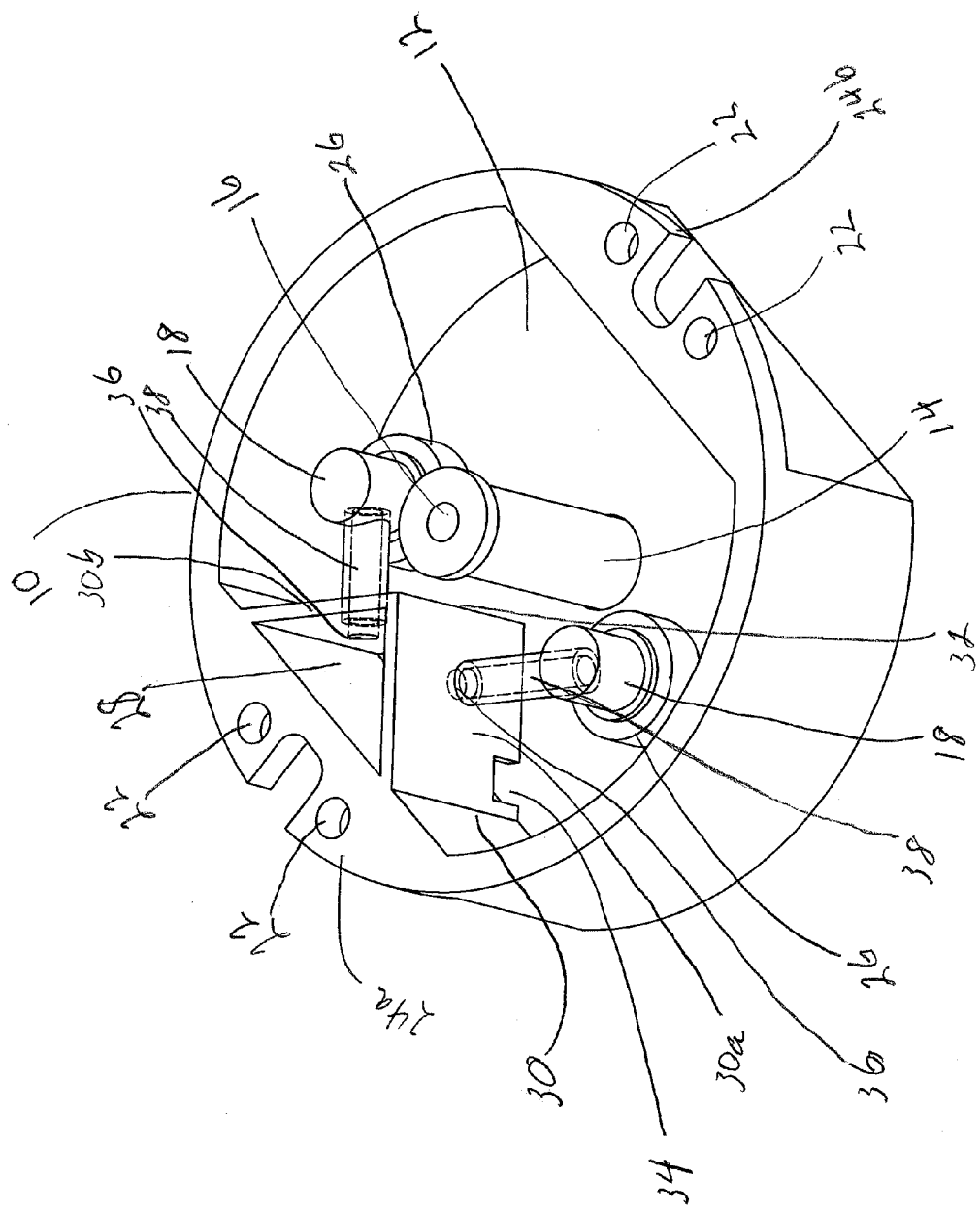
FIG. 2 is a manifold showing the interior mixing chamber with a central injector and inlet injectors where the inlet injectors have tubes with bores which open into a confinement chamber as defined by a V plate.

FIG. 2 is another embodiment of the manifold 10 showing the mixing chamber 12, with the central injector 14, center bore 16 and inlet injectors 18. In this embodiment a confinement chamber 28 is defined by a V shaped plate 30 having two separate plates 30a and 30b. Each plate has four sides and two faces, an inner face and an outer face. The plates join at a common side and are contiguous along ridge 32. A top side of each plate joins a top side of the manifold and each back side of each plate joins the back side of the manifold to form the confinement chamber. One or both plates of the V plate may have an opening 34 for the egress of gas from the confinement chamber. Each face of the V plate has a hole 36, which allows gas passing through the bore of the inlet injectors into tube 38 to pass into the confinement chamber. Tube 38 has an orifice at each end. Unlike the embodiment of FIG. 1, the inlet injectors are not rotatable about their central axis in the assembled manifold. They are aligned prior to final assembly of the manifold.

Figure 3:
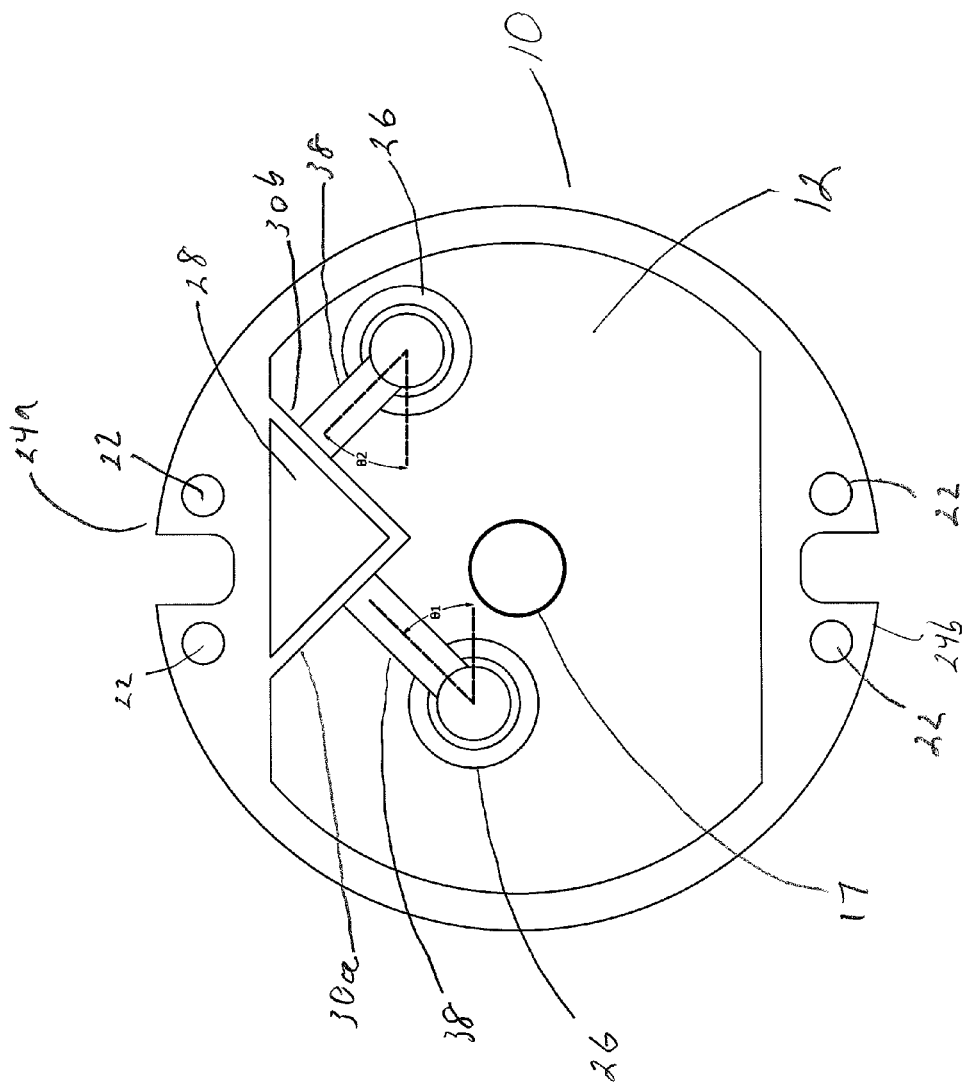
FIG. 3 is a front view of the manifold showing the mixing chamber, confinement chamber with V plate and the angles $\theta$ and $\theta_2$ from horizontal at which the inlet injectors are adjusted.

FIG. 3 shows the mixing chamber 12 of the manifold 10 and the confinement chamber 28 with angles θ and $θ_2$ from horizontal for the left and the right inlet injectors, respectively. The angles $θ_1$ and $θ_2$ are any angle which enables the gases to impinge on each other. The flow angles depend on the velocities (flow rate/area outlet) and flow rates of the gases, the location of the injection points. Preferably the angles from horizontal for the right injector range from 15° to 40° and for the left injector the angle is preferably from 30° to 50°. Most preferably the gases intersect at the same point in space in the mixing chamber or confinement chamber. Although the inlet injectors are shown in different horizontal planes in FIG. 3, preferably they are in the same horizontal plane.

While FIGS. 1, 2 and 3 show two inlet injectors within the mixing chamber, it is envisioned that more than two inlet injectors may be present. There may be as many inlet injectors as there are gases to be introduced into the mixing chamber. There are at least two inlet injectors. Each inlet injector is connected to a source for gas reactants and each gas may be introduced into the mixing chamber through individual inlet injectors. Alternatively, one or more gases may be mixed and then introduced into the mixing chamber where the gases from the two or more inlet injectors impinge on each other to form a uniform mixture of gases. In general, the greater the flow rate of gases the larger the mixing chamber.

A dispersion plate encloses one side of the mixing chamber of the manifold. The dispersion plate is made of materials which do not interact with the gases which come in contact with it. Such materials include, but are not limited to, graphite, quartz, alumina, silicon carbide and silicon nitride. The dispersion plate includes a plurality of holes on its face. The central injector terminates at the dispersion plate and has a plurality of holes. Each hole in the central injector is aligned to a hole in the dispersion plate to provide cross-jet interaction between the gases from the mixing chamber of the manifold and the gases passing through the central injector. The central injector is positioned such that cross-jet interaction is enabled. Preferably the central injector terminates at the center of the dispersion plate with the holes on the face of the dispersion plate circumvallating the central injector. Mixed gases passing through the plurality of holes in the dispersion plate impinge on gases passing through the holes from the central injector in a cross-jet configuration. The cross-jet configuration promotes substantially uniform mixing of reacting gases and directs deposition of solid product onto chamber walls or mandrels. Preferably the gases passing through the holes in the dispersion plate impinge on the gases passing through the holes in the central injector at right angles. The number of holes in the dispersion plate and the central injector is not limited provided that the number of holes in the dispersion plate corresponds to the number of holes in the central injector. Preferably the number of holes in each component is from 2-12, more preferably from 4-8. The size of the holes in the dispersion plate need not be the same size as in the central injector.

Figure 4:
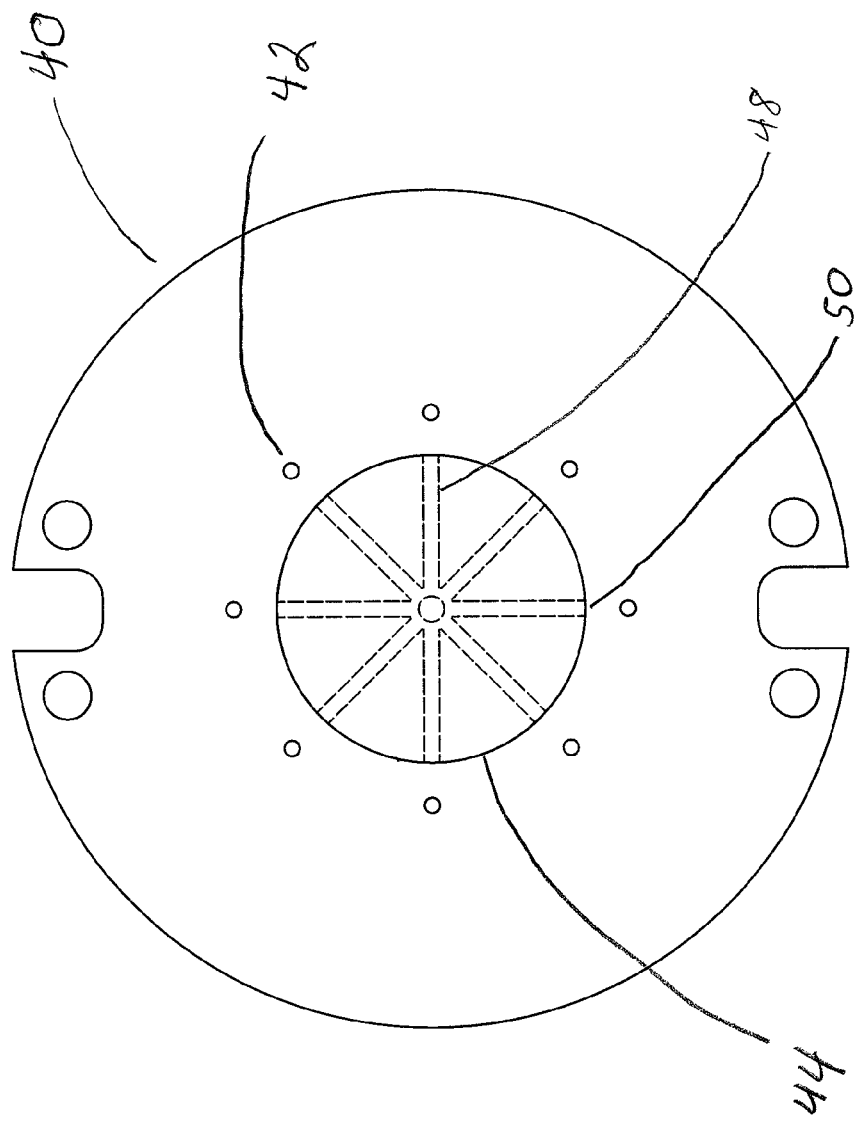
FIG. 4 is a dispersion plate with a plurality of holes in the face of the dispersion plate and a central radial injector with tubes with holes aligned with the holes in the face of the dispersion plate.
Figure 5:
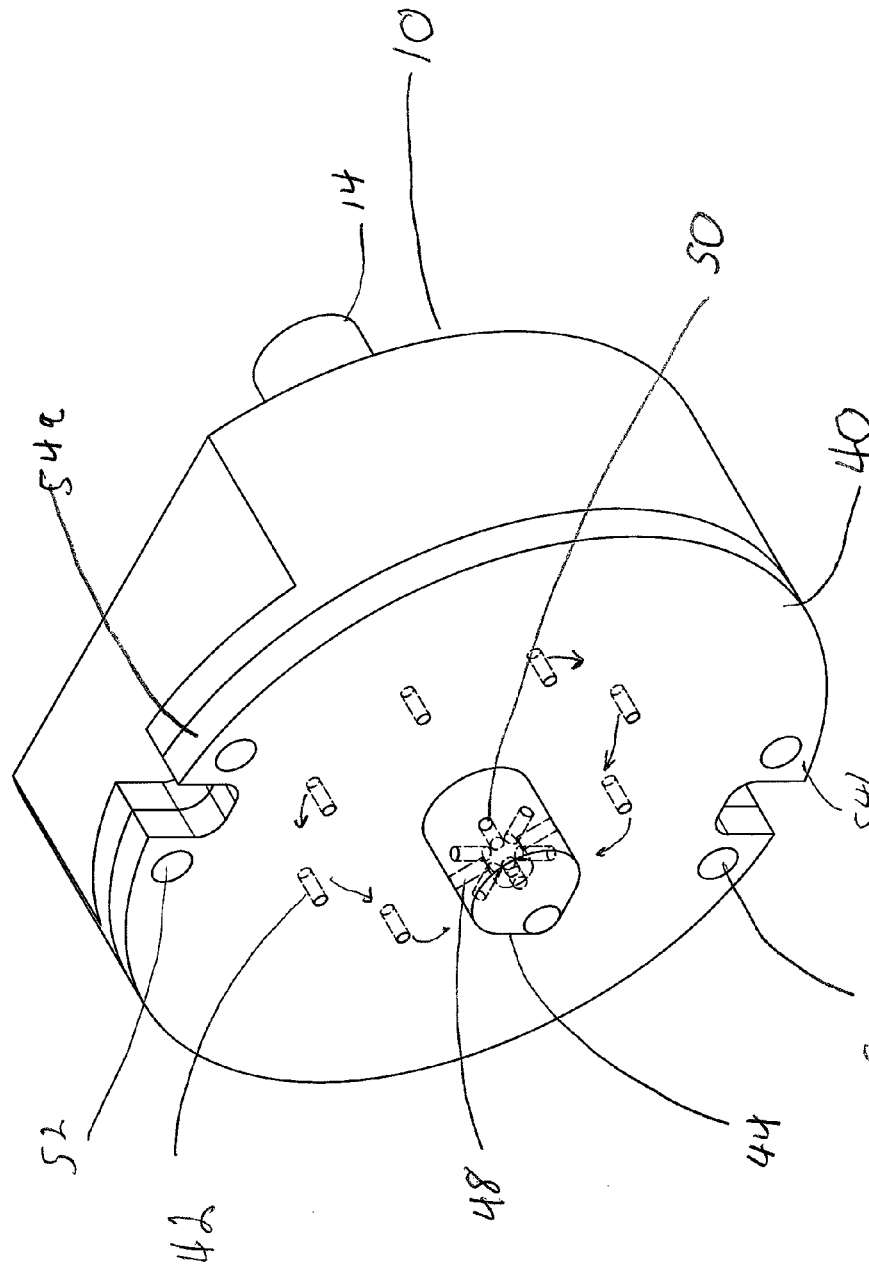
FIG. 5 shows the manifold with the dispersion plate covering the mixing chamber of the manifold, the dispersion plate includes a plurality of holes in the face of the dispersion plate and a central radial injector with holes which are aligned with the holes in the face of the dispersion plate.

FIG. 4 shows one embodiment of the dispersion plate. As shown in FIG. 4 the dispersion plate includes a plurality of holes 42, where uniformly mixed gases pass from the mixing chamber. The central injector terminates in a radial injector 44. The radial injector includes a plurality of tubes 48 with openings 50 for the egress of gases which pass through the central injector. Each hole in the radial injector is aligned with a corresponding hole in the face of the dispersion plate. The uniformly mixed gases passing through the holes in the face of the dispersion plate impinge on the gases passing through the holes in the radial injector in a cross-jet configuration. FIG. 5 shows an assembly of the manifold 10 with the dispersion plate 40 enclosing the mixing chamber. The dispersion plate is joined to the rest of the manifold by bolts or securing pegs (not shown) which are inserted in holes 52 in flanges 54a and 54b.

The manifold is joined to an enclosed deposition chamber where the gases chemically react to deposit a solid compound on the walls of the deposition chamber or on mandrels attached to the sides of the deposition chamber. The deposition chamber has an aspect ratio of less than or equal to 20 but greater than 0.5, preferably the aspect ratio is 2-5. The aspect ratio is the length to the width of the chamber. The deposition chamber may be of any shape or size provided it has the desired aspect ratio. Typically the deposition chamber is cylindrical, rectangular or square. The mandrels may be any shape as long as they fit within the deposition chamber. Typically the mandrels are rectangular or square. Typically, the mandrels are of graphite but other materials may also be used such as alumina, BN, SiC, pyrolytic graphite, quartz, $SiO_2$ and silicon nitride. Such alternative materials are well known in the art. The manifold may be joined to the deposition chamber by any suitable means, such as by nuts and bolts. A side of a deposition chamber wall having bores may receive the manifold having flanges with bores for inserting the bolts. The bores in the flanges of the manifold correspond to the bores in the side of the deposition chamber wall. Optionally, but preferably, the deposition chamber may include a baffle. The baffle is situated in the deposition chamber such that it assists in the direction of flow of the reacting gases to the sides of the deposition chamber and also may function as an additional deposition surface. It is situated in the chamber such that it does not cause significant obstruction of deposition of solid product on the walls of the chamber or on the baffle itself. Minor experimentation may be done to determine the desired position of the baffle in the deposition chamber. The desired position may depend on the size and the shape of the deposition chamber. The baffle may be of any size or shape provided it is of a suitable size to be placed in the deposition chamber without substantially compromising the deposition of solid product.

Figure 6:
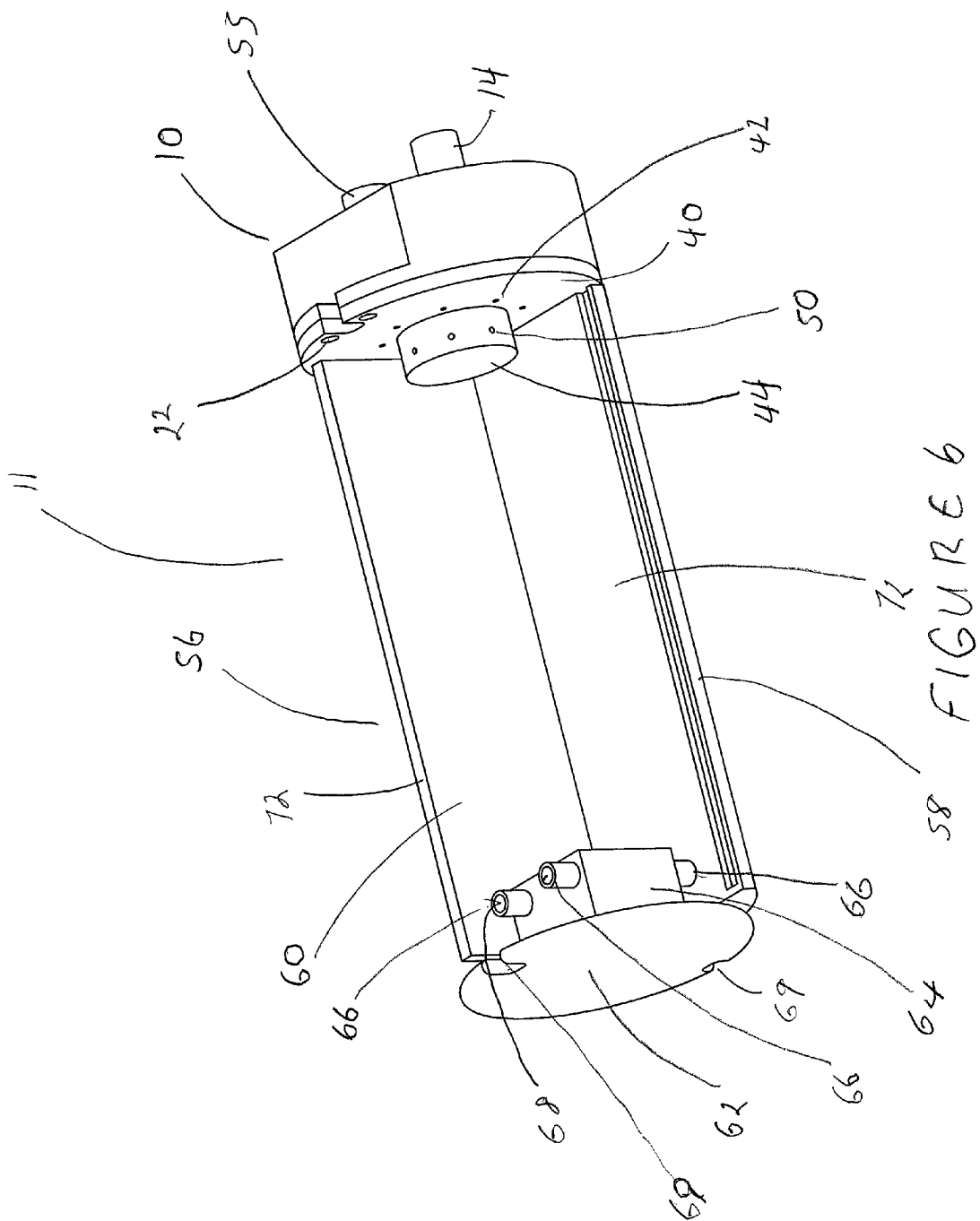
FIG. 6 shows the assembly of the manifold, dispersion plate and deposition chamber with baffle.

FIG. 6 is a view of one embodiment showing the assembly 11 of the manifold, dispersion plate and deposition chamber. This view shows the inside of the deposition chamber 56 and the manifold with attached deposition plate. Tube 55 provides a means for transporting gases from their source (not shown) into the inlet injectors for mixing in the mixing chamber. The deposition chamber 56 is cylindrical with an outer wall 58 which circumvallates the interior space 60 where the gases react. One end the chamber is enclosed by the manifold. The manifold is joined to the outer wall by bolts (not shown). The opposite end of the chamber is joined to a base 62. A baffle 64 having a rectangular shape is contiguous with the base. Spacers 66 on the baffle next to each other pass through the baffle. Each spacer is a tube with a hole 68 at each end to receive bolts which secure the base and baffle to the bottom of the mandrels by nuts. The mandrels which attach to the base have holes (not shown) which correspond to the holes of the spacers for inserting bolts. A space 69 at the bottom of the assembly is joined to a vacuum (not shown) to allow any unreacted gasses to pass from the deposition chamber. The solid product is deposited on a plurality of mandrels 72 which are contiguous with the deposition chamber wall 58 and compose the interior walls of the deposition chamber.

The manifold and deposition chamber are placed in a furnace which provides the heat of reaction for the different reacting gas mixtures. Conventional furnaces which are used for CVD or PVD may be used. Furnace temperatures may range from 200° C. to 2000° C. Furnace pressures may range from 1 Torr to 760 Torr. Depending on the type and size of the furnace, the assembly of the deposition chamber and the manifold may be placed horizontally or vertically in the furnace. Such furnaces are designed to allow the assembly to be connected to outside sources of gas reactants as well as waste removal devices for removing any unreacted gases from the deposition chamber. Typically such furnaces have multiple temperature and pressure zones allowing the temperature and pressure in one zone to vary from another zone. Such varying temperature and pressure zones enable control of the reaction process to prevent premature reactions among the gases introduced into the manifold and deposition chamber assembly.

Figure 7:
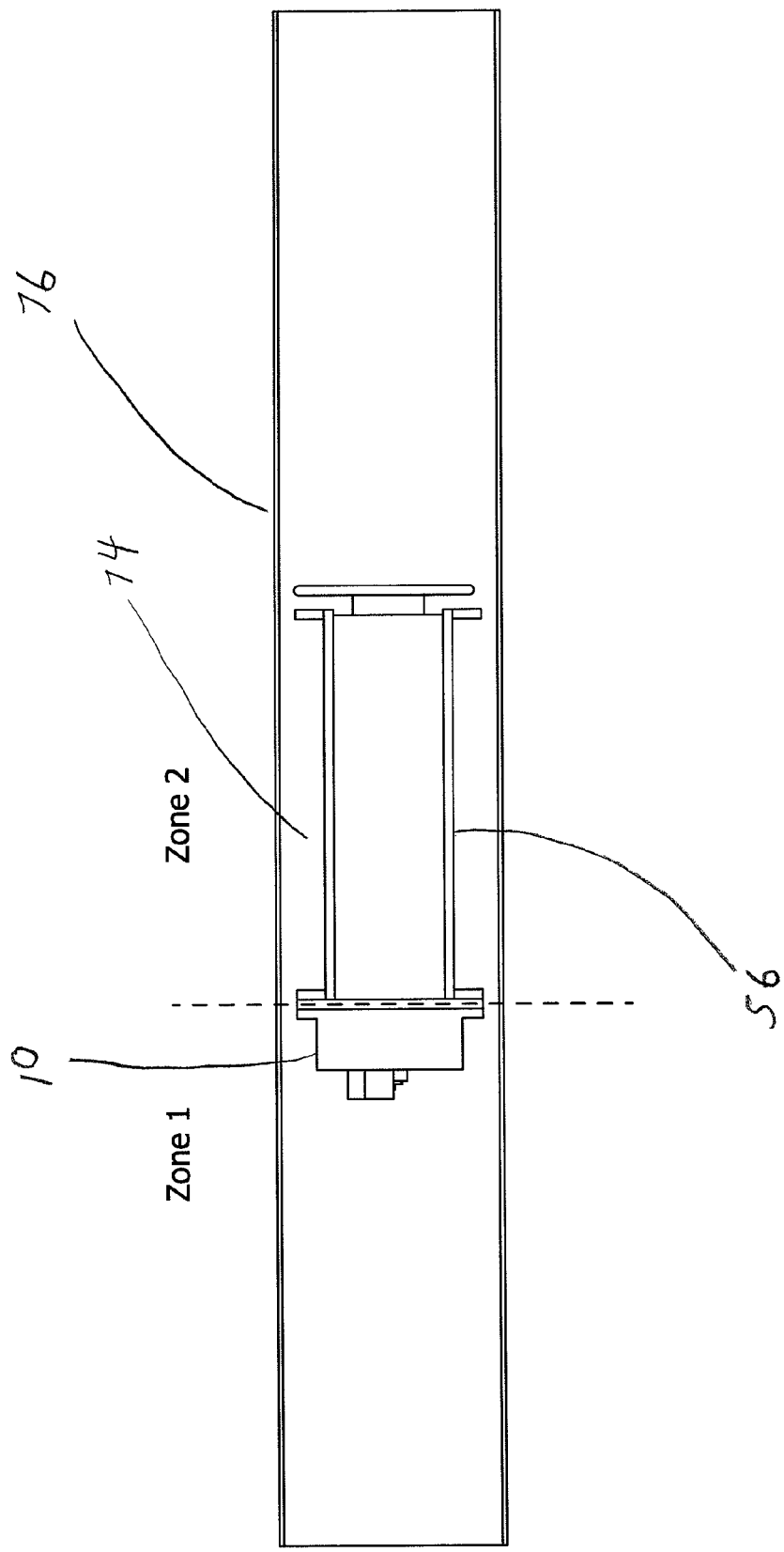
FIG. 7 is a schematic showing an assembly including a manifold joined to a deposition chamber horizontally placed in a furnace having at least two zones.

FIG. 7 is a schematic showing an assembly 74 including a manifold 10 joined to a deposition chamber 56 horizontally placed in a furnace 76 having at least two zones to control temperature and pressure. Zone 1 and Zone 2 of the furnace are divided by an imaginary vertical line. Temperatures and pressures in zone 1 may be varied to allow gases entering into the manifold and central injector to be at conditions where mixing occurs but there are no chemical reactions taking place. The temperature in zone 1 may be as low as room temperature. In contrast, zone 2 is at temperatures and pressures where the gas mixtures may react to form reaction products which deposit on the sides or mandrels or the deposition chamber.

Figure 8:
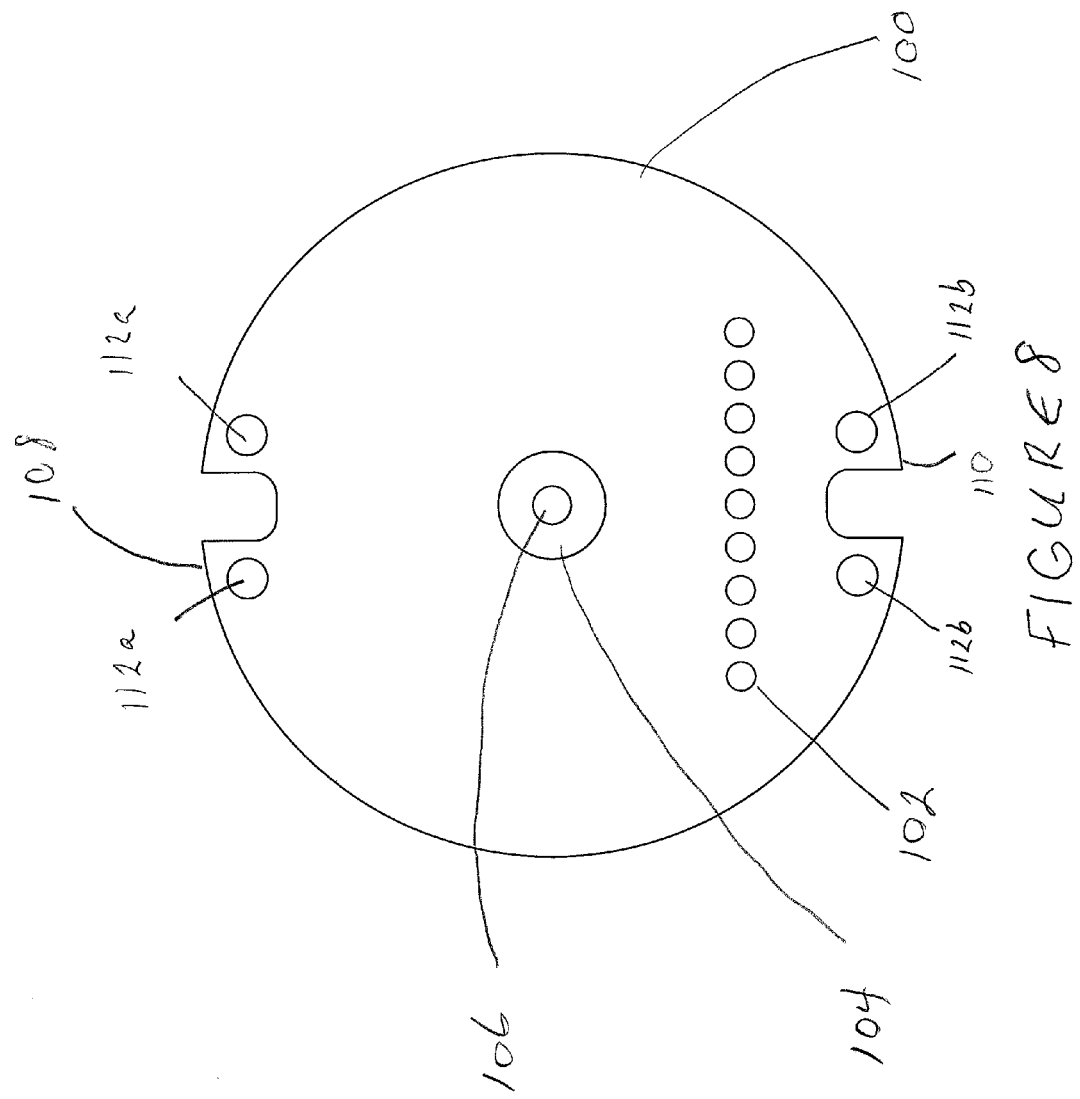
FIG. 8 is a dispersion plate with a central injector and a plurality of holes on the same horizontal plane.

In another embodiment the assembly may include a manifold joined to a plenum where both the manifold and the plenum are joined to a parallel plate deposition chamber. Each parallel plate has a first end and a second end distal to the first end. Each parallel plate has two faces and four sides or edges. There is a left and a right side as well as a front and a back side. The parallel plates may have enclosing sides which are of the same length as the plates. The enclosing sides may be joined to the left and right edges of the two parallel plates. The parallel plates and the enclosing sides form a deposition chamber with an open distal end. The parallel plates may be of any length and width; however, the space between each plate, which defines the deposition chamber, is 2.5 cm or less but not 0. This design provides a small enough cross-sectional area to provide high shear and high velocity, such as greater than 10 cm/second, near the surface of each parallel plate such that the parallel plates remain substantially free of undesired powder interference during solid product deposition. The parallel plate arrangement also provides a large surface volume ratio of 1/space between the plates for a rectangular chamber that favors surface reactions against gas phase volumetric reactions and thus suppresses powder formation and promotes solid product deposition. A source of gases for the manifold is joined at a back side of the manifold and the source joins a plurality of inlet injectors also on the back side of the manifold. The inlet injectors open into a mixing chamber as shown in FIG. 1. For each inlet injector there is a separate source for a gas or a mixture of gases. Alternatively, the manifold may have the structure as shown in FIG. 2 with tubes joined to the inlet injectors which provide gas ingress into a confinement chamber. The mixing chamber of the manifold is enclosed at one end by a dispersion plate having a plurality of holes for the flow of substantially uniformly mixed gases from the mixing chamber and into an adjoining plenum. The dispersion plate 100 as shown in FIG. 8 includes a plurality of holes 102 which are all in the same horizontal plane. The dimensions of the holes are the same as described above. Gases pass from the mixing chamber, through the holes and into the deposition chamber. The dispersion plate also includes central injector 104 with a bore 106. The central injector provides another source of gases. The central injector passes through the manifold and deposits the gases into the plenum. The dispersion plate includes upper 108 and lower 110 flanges which include holes 112a and 112b for joining the dispersion plate to one side of the manifold. The manifold includes corresponding flanges and holes as shown in FIGS. 1 and 2. The dispersion plate may be joined to the manifold by bolts or by pegs (not shown) to enclose the mixing chamber of the manifold.

The plenum includes a plurality of tapered holes for the allowing gases in the plenum chamber to pass into the deposition chamber and impinge on the gases from the manifold in a cross-jet pattern at a point in space within the deposition chamber. The tapered holes of the plenum prevent back flow of gases into the plenum chamber.

Figure 9:
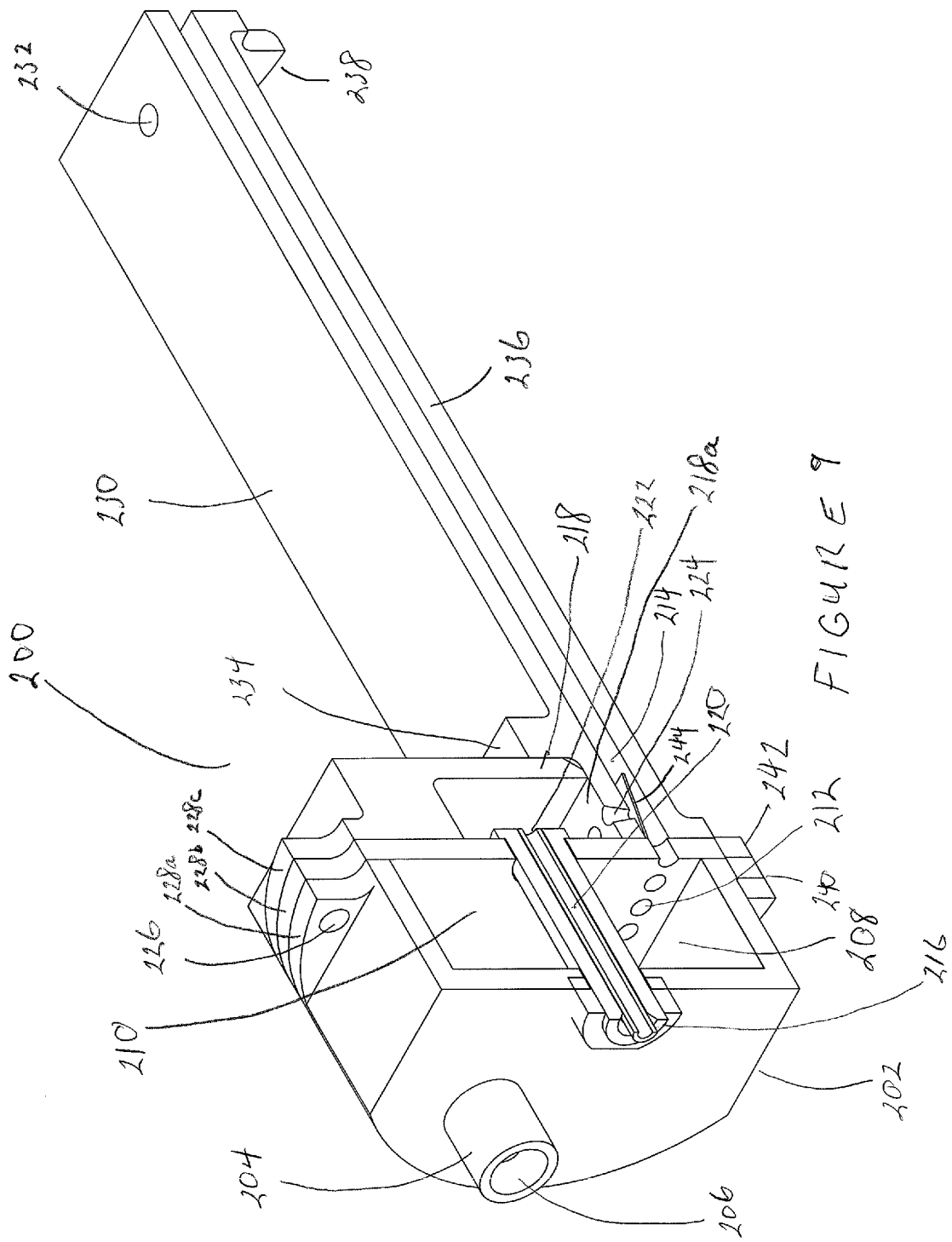
FIG. 9 is shows a parallel plate assembly which includes a manifold, plenum and deposition chamber with parallel plates.

FIG. 9 shows a ½ section of one embodiment of the parallel plate assembly 200. The assembly includes a manifold 202 having six sides. The back side of the manifold includes a tube 204 with an opening 206 which is connected to a source of gas or mixture of gases (not shown) which enables the gas or mixture of gasses to pass into an inlet injector (not shown) for the ingress of gas or mixture of gases into the mixing chamber 208 or confinement chamber (not shown) where gases form a substantially uniform mixture. A dispersion plate 210 encloses the mixing chamber of the manifold on the front side. The dispersion plate includes a plurality of holes 212 for the substantially uniform mixture of gases to pass from the manifold into the dispersion chamber 214. A central injector 216 passes through the manifold and opens into plenum 218. The plenum has six sides. The central injector includes a tube 220 which is connected to a source (not shown) of additional gas or mixture of gases. The additional gases pass through the tube of the central injector and empty into the plenum through opening 222. The gases from the plenum pass into the deposition chamber via a plurality of holes 224 situated in the plenum floor 218a. For each hole in the plenum floor there is a corresponding hole in the dispersion plate. Each hole in the plenum floor is aligned to a hole in the dispersion plate. The manifold, dispersion plate and plenum are joined to each other by bolts or pegs inserted into bore 226 on flange 228a which is contiguous with a top side of the manifold. The dispersion plate and the plenum have corresponding bores (not shown) on their respective flanges 228b and 228c. These flanges are also contiguous with the dispersion plate and plenum. A top parallel plate 230 with hole 232 is joined to a front side of the plenum at one end by abutting ridge 234. This ridge is contiguous with the top plate. Hole 232 is optional and there is a corresponding hole in the bottom plate. The holes allow a bolt to be passed through each hole to align the top and bottom plates. The plenum floor 218a which includes the plurality of holes is contiguous with the top parallel plate and secures (not shown) the top parallel plate to the dispersion plate with bolts. Joining bores (not shown) on the horizontal plane above the holes of the dispersion plate correspond to bores in a back side of the plenum floor (not shown) to secure the top plate to the dispersion plate. The bottom parallel plate 236 which may have the same length, width and thickness as the top parallel plate is joined to the assembly at the dispersion plate just below the horizontal plane where the plurality of holes are assembled. Another set of joining bores (not shown) below the horizontal plane of the holes of the dispersion plate for receiving bolts correspond to a set of bores in a back side of the bottom parallel plate (not shown). The bottom parallel plate includes a bottom support 238 contiguous with the bottom parallel plate at the bottom plates end distal to the manifold and plenum. The manifold also includes a bottom support 240 which is contiguous with the bottom side of the manifold and a bottom surface of the dispersion plate also includes a flange 242 a side which abuts a side of the bottom support of the manifold. The bottom supports enable the assembly to be placed horizontally in a furnace. Optionally, a baffle 244 may be included in the dispersion chamber. The baffle is secured at an angle by slots (not shown) on sides (not shown) joined to the top and bottom parallel plates which enclose the parallel plate deposition chamber on either side. The baffle in this embodiment separates gases passing from the plenum and from the manifold and delays mixing downstream to assist in preventing plugging of the plenum holes and the manifold holes.

Figure 10:
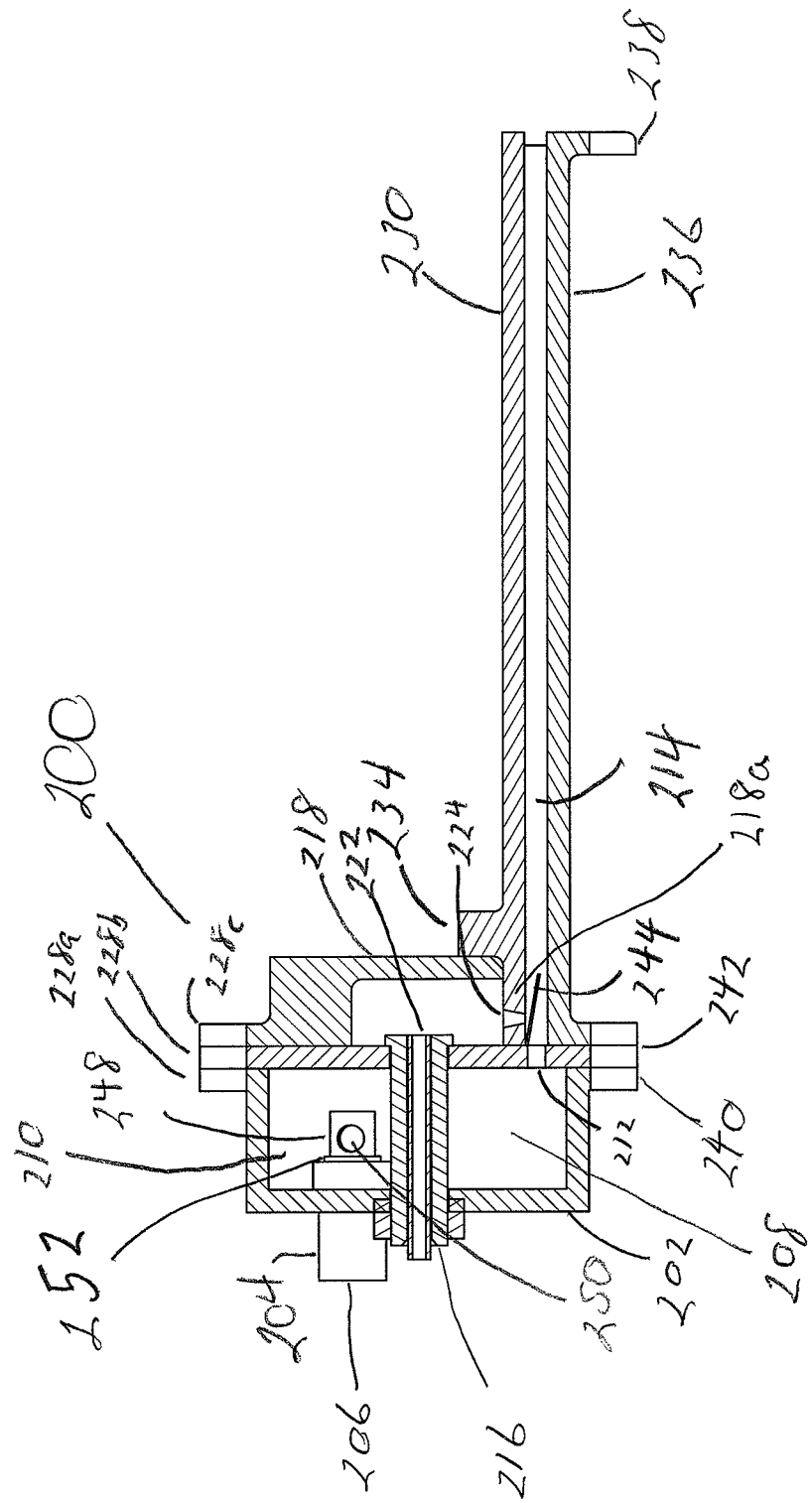
FIG. 10 is a lateral view of the parallel plate assembly.
Figure 11:
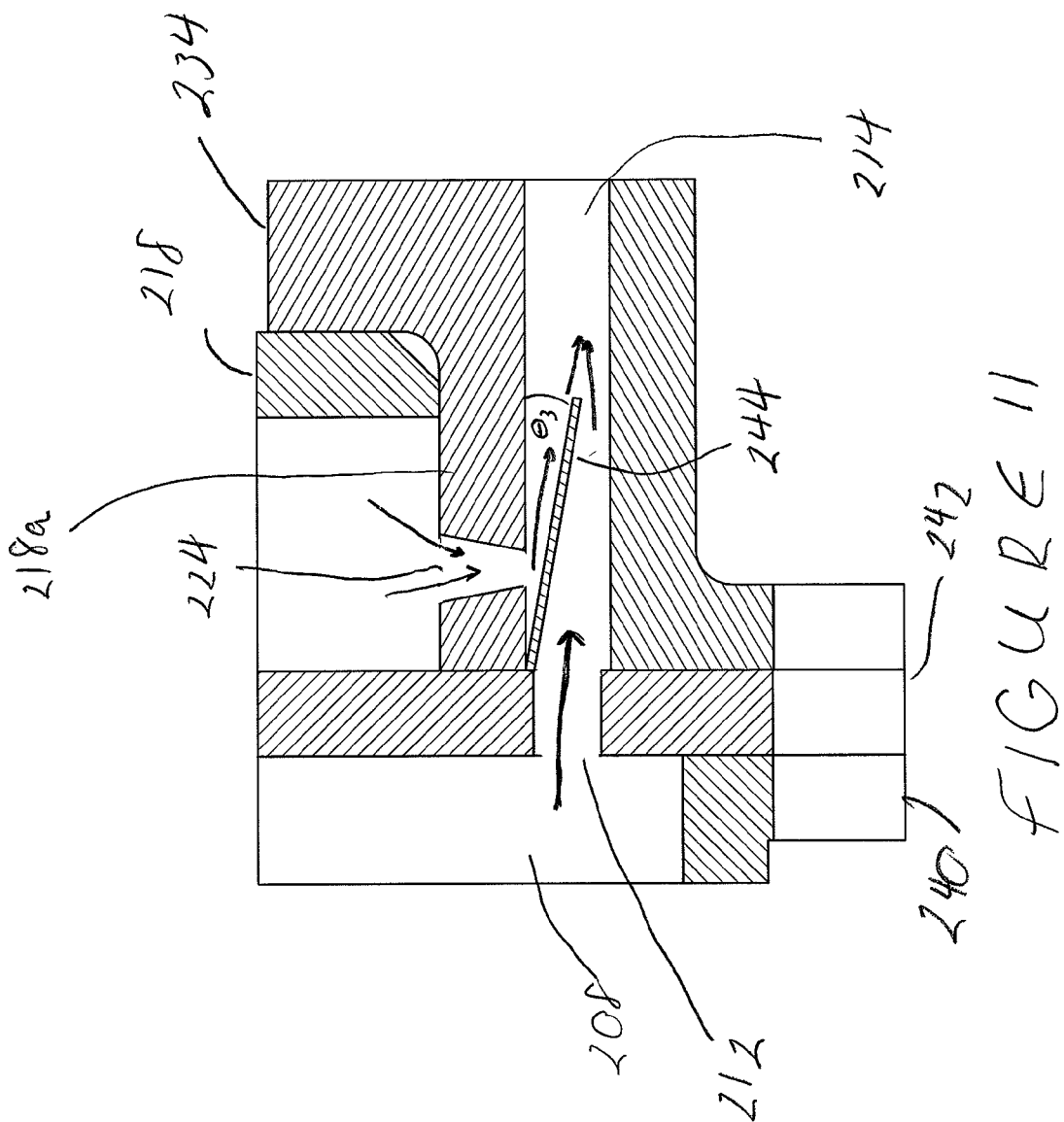
FIG. 11 is a schematic of the mixing chamber of the manifold, dispersion plate holes plenum chamber, holes of the plenum and baffle arrangement of the parallel plate assembly.

FIG. 10 is a lateral view of the parallel plate assembly. In this Figure one of a plurality of inlet injectors with a bore 250 is shown in the manifold mixing chamber. The inlet injector is joined to tube 204 and is rotatable 360° around the tube for adjusting the position of the bore. A gasket 252 surrounds the neck of the inlet injector. FIG. 11 is a schematic of a section of the parallel plate assembly showing the mixing chamber of the manifold, dispersion plate holes, plenum chamber, holes of the plenum and baffle arrangement. The arrows show the direction of gas flow through the holes of the dispersion plate and the plenum floor 218a. The baffle is adjusted to angle $\theta_3$ such that the gases from the mixing chamber of the manifold impinge on the gases from the plenum at a common point in space within the deposition chamber. Typically $\theta_3$ ranges from 5-20 degrees.

Figure 12A:
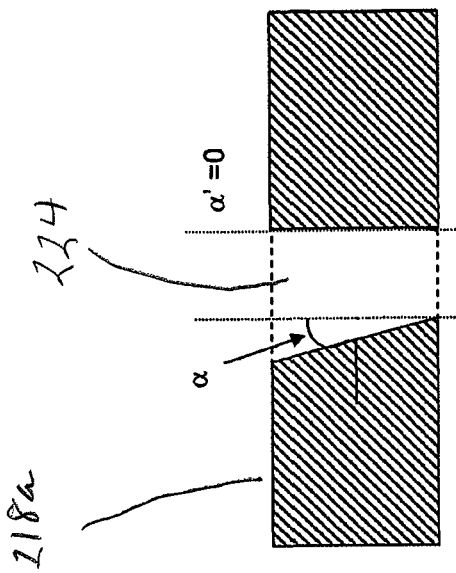
FIG. 12a illustrates a plenum floor with a tapered design where the taper angles $\alpha$ and $\alpha'$ are greater than 0.
Figure 12B:
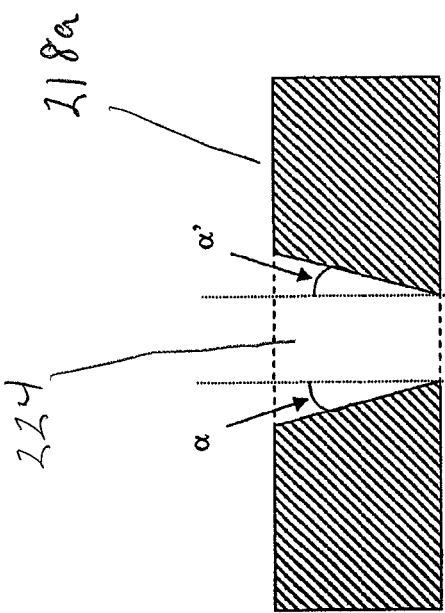
FIG. 12b illustrates a plenum floor with a tapered design where the taper angle $\alpha$ is greater than 0 and $\alpha'$ is 0.

The structure of the plurality of holes in the plenum floor 218a has a tapered design to prevent any backflow of gases into the plenum chamber. As illustrated in FIG. 12 some embodiments of the plenum use a taper of side walls of the hole 224 that is a single taper. The term "single taper" refers to tapers that have angles α and α' with respect to the plane perpendicular to the surface of the plenum floor. The taper of the holes may have any desirable angle with respect to the plane perpendicular to the surface of the plenum floor where the holes are located. The angles α and α' may independently vary from 0-90 degrees, provided that they are not both 0 degrees. In some embodiments the tapered holes may have an angle α or α' that is greater than 0 degrees. In some embodiments the angles α and α' are determined with respect to the central axis of the holes rather than a plane perpendicular to the surface of the plenum floor. In some embodiments the angles α and α' are greater than 0 degrees and less than 90 degrees. In some embodiments the lower limit of the range of angles for α and α' of the holes is from 5 degrees, 10 degrees, 15 degrees, 20 degrees, 25 degrees, 30 degrees, 35 degrees, 40 degrees, 45 degrees, 50 degrees, or 55 degrees with respect to the plane perpendicular to the surface of the plenum floor. The upper limit of the range of suitable angels for the angle for α and α' of the holes may be 5 degrees, 10 degrees, 15 degrees, 20 degrees, 25 degrees, 30 degrees, 35 degrees, 40 degrees, 45 degrees, 50 degrees, 55 degrees, 60 degrees, 75 degrees, or 85 degrees depending on the desired flow characteristics and other design parameters. Typical lower limits for α and α' are 5 degrees, 10 degrees or 15 degrees. Angles from 45 degrees to 60 degrees are typical upper limits. In a preferred embodiment the angles α and α' are from 10 degrees to 30 degrees. In one embodiment the angles α and α' are 10 degrees to 15 degrees. Consequently, the taper generally provides a hole that is wider on the outer surface of the plenum floor than it is on the inner surface. However, in some embodiments the opposite may be true. In other words the taper may be formed to provide a hole whose opening on the outer surface is narrower than the opening on the inner surface of the plenum floor.

Figure 13A:
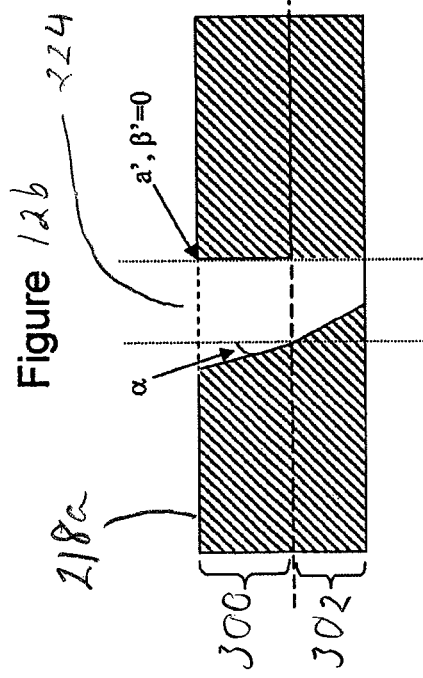
FIG. 13a illustrates tapered holes with an upper section where angle α is greater than 0 and a lower section has angle β which also is greater than 0.
Figure 13B:
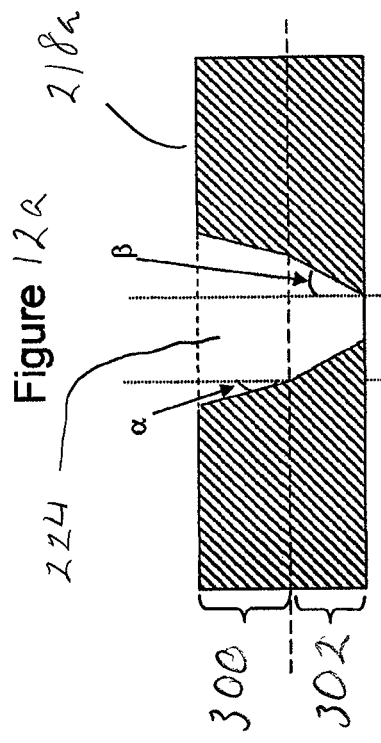
FIG. 13b illustrates tapered holes with an upper section where angle α is greater than 0 and a lower section where β' is 0.

As shown in FIG. 13 the tapered holes have more than one angel with respect to the plane perpendicular to the surface of the plenum. Thus, in some embodiments the hole may have an upper section 300 with angles α and α' that may take angles described above and lower section 302 where the sidewalls of the holes have angles β and β' that range from 0 degrees to less than 90 degrees. In such embodiments the lower limit on the range of values for angles α and α' is 0 degrees, 5 degrees, 10 degrees, 15 degrees, 20 degrees, 25 degrees or 30 degrees, 35 degrees, 40 degrees, 45 degrees, 50 degrees or 55 degrees. The upper limit on the range of suitable angles α and α' for the taper of the holes in embodiments having more than one taper angle may be 30 degrees, 35 degrees, 40 degrees, 45 degrees, 50 degrees, 55 degrees, 60 degrees, 75 degrees or 85 degrees depending on the desired flow characteristics and other design parameters. Angles ranging from 5 degrees as a lower limit to 45 to 60 degrees as an upper limit range are typical. In a preferred embodiment the angle is from 10 to 30 degrees. In other embodiments the angles α and α' range from 10 to 15 degrees. The lower limit on the range of values for angles β and β' may be 0 degrees, 5 degrees, 10 degrees, 15 degrees, 20 degrees, 25 degrees or 30 degrees, 35 degrees, 40 degrees, 45 degrees, 50 degrees, 55 degrees or 60 degrees, determined in the same manner as the angles α and α'. The upper limit on the range of suitable angles β and β' for the taper of the holes in embodiments having more than one taper angle may be 30 degrees, 35 degrees, 40 degrees, 45 degrees, 50 degrees, 55 degrees, 60 degrees, 75 degrees or 85 degrees. In embodiments with multiple tapers, α and α' range typically from 0 degrees to 20 degrees while β and β' typically range from 10 to 60 degrees. In one embodiment the angle α is 0 degrees and the angle β is 45 degrees. In some embodiments α' and β' are 0 degrees. Some embodiments include a hole with three or more different angles where each angle is greater than 0 degrees and less than 90 degrees. In preferred embodiments the selection of angles provides a hole where the opening on the outer surface of the plenum floor is wider than the width of the hole at any point in the interior of the hole and the opening inner surface of the plenum floor is narrower than any point on the interior of the hole.

In other embodiments as shown in FIG. 14 the tapered holes may be orientated to both contract or expand. Thus in some embodiments the hole may have an upper section 300 with an angle α ranging from greater than 0 degrees to less than 90 degrees and a lower section 302 where the sidewalls of the hole have an angle χ that ranges from greater than 0 degrees to less than 90 degrees. The lower limit on the range of values for angle α is 0 degrees, 5 degrees, 10 degrees, 15 degrees, 20 degrees, 25 degrees or 30 degrees with respect to the plane perpendicular to the surface of the plenum floor. The upper limit on the range of suitable angles, α, for the taper of the holes in embodiments having more than one taper angle may be 30 degrees, 35 degrees, 40 degrees, 45 degrees, 50 degrees, 55 degrees, 60 degrees, 75 degrees or 85 degrees depending on the desired flow characteristics and other design parameters. Angles ranging from 5 to 45 degrees are typical. In a preferred embodiment, the angle α is from 10 degrees to 30 degrees. The lower limit range of values for angle χ may be 0 degrees, 5 degrees, 10 degrees, 15 degrees, 20 degrees, 25 degrees or 30 degrees with respect to the plane perpendicular to the surface of the plenum floor. The upper limit on the range of suitable angles, χ, for the taper of the holes in embodiments having more than one taper angle may be 30 degrees, 35 degrees, 40 degrees, 45 degrees, 50 degrees, 55 degrees, 60 degrees, 75 degrees or 85 degrees. FIG. 14 also denotes the hole axis which is defined as the central axis about which the hole is located. The hole axis (axes for multiple holes) is drawn perpendicular to the plenum floor surface, but this axis can be orientated at various angles with respect to the plenum floor surface. This angle may range from greater than 0 degrees to less than 90 degrees with a preferred angle of 5 and 45 degrees.

The apparatus disclosed above may be used in the deposition of solid compounds which when removed from the deposition chamber are free-standing monolithic compounds. In general, the deposits of solid compounds on the sides or mandrels of the deposition chamber are thick deposits. Such deposits have thicknesses of 0.1 mm or greater, preferably greater than 0.5 mm, more preferably the thickness of the deposits range from 0.5 mm to 1 mm. The apparatus may be used to make solid compounds where multiple gas reactants are used. Typically the apparatus is used to make ternary solid compounds which are free-standing and monolithic. More typically the apparatus is used to make spinel, zinc sulfoselenide and cadmium zinc telluride. Preferably the apparatus is used to make spinel.

Polycrystalline monolithic magnesium aluminate spinels are prepared from gaseous precursors of elemental magnesium, aluminum compounds and elemental oxygen or gaseous compounds containing oxygen. The gaseous precursors react with each other at a molar ratio of 1:2:4 to produce polycrystalline monolithic aluminate spinels which are at least 98% pure, typically 99.999% pure and greater.

Magnesium is used in its elemental form. Sources of elemental magnesium include, but are not limited to, inorganic magnesium compounds, such as magnesium halides, such as $MgCl_2$, $MgBr_2$, $MgI_2$, $MgF_2$, and mixtures thereof. Typically, $MgCl_2$ is used as the source of magnesium for the spinels.

The magnesium compounds are placed in a retort as a liquid or a solid. The retort is heated at temperatures of 500° C. to 1000° C. to generate gaseous elemental magnesium metal. Typically, magnesium is sublimated. Vapor pressures for magnesium compounds at such temperatures range from 0.7-10 Torr.

Aluminum compounds include, but are not limited to, inorganic aluminum compounds, such as aluminum halides, such as $AlCl_3$, $AlBr_3$, $AlI_3$ and $AlF_3$, aluminum carbonyls, such as $AL(CO)_3$, and aluminum acetonates, such as aluminum acetylacetonate, and mixtures thereof. Typically, aluminum halides and aluminum acetonates are used as the source of aluminum. More typically, aluminum halides and aluminum acetylacetonate are used as a source of aluminum. Most typically aluminum halides, such as $AlCl_3$, are used.

Aluminum metal or an aluminum compound is placed in a retort as a liquid or a solid. If aluminum metal is used, it is reacted with a halide and organic in situ to provide the desired compound. The retort is heated to temperatures of 550-850° C. Vapor pressures for the aluminum compounds at such temperatures range from 0.1-6 Torr.

Elemental oxygen or oxygen containing compounds are pumped into the furnace using conventional apparatus. Sources of oxygen include, but are not limited to, gaseous $O_2$, $CO_2$, $NO_2$, $SO_2$, $H_2O_2$, $O_3$, $N_2O$ and $H_2O$. Typically gaseous $O_2$, $CO_2$, $N_2O$ and $H_2O$ are used as sources of oxygen. Water vapor may be produced by reacting hydrogen gas with carbon dioxide.

Optionally, the above gaseous reactants may be introduced into the CVD apparatus with one or more diluent gases. Such carrier gases include, but are not limited to, hydrogen, HCl, nitrogen, argon and neon.

One or more magnesium compounds with optionally one or more sources of diluent gases are introduced into the mixing chamber or confinement chamber from the retort using conventional transport means and into one or more inlet injectors. One or more aluminum compounds optionally mixed with one or more sources of diluent gases are transported from the retort using conventional transport means and introduced into one or more inlet injectors which are separate from the inlet injectors which introduce the magnesium compounds. The one or more magnesium compounds and the one or more aluminum compounds with optional diluent gases impinge on each other in the mixing chamber or confinement chamber of the manifold to form a substantially uniform mixture. The substantially uniform mixture of gases passes through the holes of the dispersion plate and into the deposition chamber. One or more sources or oxygen with optional diluent gases are transported from their source using conventional means and pass into the central injector. The one or more oxygen sources pass through the holes of the central injector and into the deposition chamber. The substantially uniform mixture of gases from the manifold and the gases from the central injector impinge on each other in a cross-jet configuration within the deposition chamber to form a uniform mixture of gaseous reactants. The reactants chemically react to deposit spinel on the sides of the deposition chamber or on mandrels situated along the sides of the deposition chamber.

Spinel is deposited on substrates, such as the walls of the deposition chamber or mandrels at temperatures of 700-1600° C. The spinel is deposited on the substrates at deposition rates of 0.1-5 µm/minute.

Typically the flow rates for the aluminum and magnesium gases through the inlet injectors range from 0.01 slpm to 5 slpm. Flow rates for oxygen and its compounds through the central injector, typically, range from 0.01 slpm to 10 slpm. Flow rates for diluent gases typically range from 0.01 slpm to 10 slpm.

The polycrystalline monolithic magnesium aluminate forms deposits having a thickness of 0.1 mm or greater. Preferably the deposit thickness ranges from 0.5 mm to 1 mm.

Zinc sulfo-selenide may be produced by first thoroughly mixing hydrogen sulfide, hydrogen selenide and optionally a diluents gas such as argon in the mixing chamber or confinement chamber of the manifold. Temperatures range from 650-900° C. and pressures from 20-100 Torr. Deposition rates may range from 0.1-5 microns/min The manifold and deposition chamber assembly is in a conventional furnace used for CVD processes. Each gas is introduced into the mixing chamber by separate inlet injectors to mix the gases. This substantially uniform mixture is then introduced into a deposition chamber using a water cooled central injector. Argon is used as a diluent gas to transport gaseous zinc from a retort to the deposition chamber through multiple holes located around the central injector. Any suitable source of zinc which may be vaporized in the retort may be used. Typically zinc metal, zinc chloride or zinc oxide provides the source of zinc. The zinc is vaporized in the retort at temperatures of 600-750° C. Zinc vapor pressures range from 10-12 Torr. Inside the deposition chamber, the substantially uniform hydrogen sulfide and hydrogen selenide mix with gaseous zinc inside the deposition chamber. The zinc sulfo-selenide is deposited on substrates, such as on the walls of the deposition chamber or mandrels at temperatures of 650-900° C. The zinc sulfo-selenide is deposited on the substrates at deposition rates of 0.1-5 µm/minute. The zinc sulfo-selenide forms a deposit having a thickness of 0.1 mm or greater, preferably 0.5 mm to 20 mm.

Cadmium zinc telluride may be prepared by vaporizing cadmium metal or one or more compounds of cadmium in a retort at temperatures of 300-700° C. Pressures may range from 20-100 Torr. Sources of cadmium include cadmium acetylacetonate, cadmium trifluoromethanesulfonate, diethyl cadmium, dimethyl cadmium and methyl allyl cadmium. Zinc may be provided for as discussed above in the preparation of zinc sulfo-selenide. The cadmium and zinc may be transported using hydrogen gas to separate inlet injectors of the manifold and then mixed in the mixing chamber or confinement chamber to form a substantially uniform mixture of cadmium and zinc vapor. The manifold and deposition chamber assembly are in a conventional furnace used for CVD processes. Diethyltelluride or dimethyltelluride is introduced into the deposition chamber using a water cooled central injector. The metal streams impinge on and thoroughly mix with the diethyltelluride shortly after entering the deposition chamber to produce homogenous cadmium zinc telluride on the walls of the deposition chamber which are at temperatures of 400-800° C. Furnace pressure ranges from 20-100 Torr. Deposition rate may range from 0.1-5 µm/minute. The thickness of the cadmium zinc telluride may have a thickness of 0.1 mm or greater, preferably from 0.5 mm to 1 mm.

The following examples further illustrate the invention but are not intended to limit its scope.

EXAMPLE 1

Two retorts were provided. One was for the formation of vaporous $AlCl_3$ and the second for vaporous formation of $MgCl_2$. The temperatures and the pressures in the retorts were 600° C. and 125 Torr and 915° C. and 125 Torr, respectively. The flows of $AlCl_3$ and $MgCl_2$ through a manifold having a configuration as shown in FIG. 2 were simulated with an inlet dispersion plate that contained four holes of equal diameter symmetrically arranged around a central injector. The diameters of the holes were 0.23 cm. The simulation was a computer simulation using ANSYS FLUENT 13 computational fluid dynamics software program (available from ANSYS Inc., Canonsburg, Pa., U.S.A.). The manifold was connected to the deposition chamber as shown in FIG. 6. Total flow rate of 0.78 slpm included $AlCl_3$, $H_2$, HCl and $N_2$ at the individual flow rates of 0.06 slpm, 0.09 slpm, 0.13 slpm and 0.5 slpm, respectively. These gases were flowed through the right injector. Total flow rate of 1.41 slpm included $MgCl_2$ and $N_2$ at the flow rate of 0.03 slpm and 1.38 slpm, respectively. These gases were flowed through the left injector. The gases from the right and left injector impinged on each other within the confinement chamber and mixed by convective mixing to form a substantially uniform mixture. The flows of gases such as $H_2$, $N_2$ and HCl were measured using mass flow controllers from Brooks Instrument, Hatfield, Pa. The $AlCl_3$ and $MgCl_2$ flows were calculated from weight loss measurements of the retorts before and after the run. The total mass flow and the mass flow of each chloride through each of the four holes came out uniform with the total variation (max flow−min flow)/(average flow through all the holes of the dispersion plate) equal to or less than 1.6% of the average flow. Mass flows of the chlorides were measured because they were important reagents in the formation of spinel. Although the total variation was greater than 0, it was well below 20% and even below 5%. Accordingly, 1.6% was a low value and showed that the apparatus had good mixing.

EXAMPLE 2

The method in Example 1 was repeated using the same gases and flow rates except a manifold having the design shown in FIG. 1 was used. The same chloride flows were simulated using ANSYS FLUENT 13 computational fluid dynamics software program. This manifold design also provided good mixing of total flow. The chloride reagent flows had a total variation (max flow−min flow)/(average flow through all the holes in the dispersion plate) equal to less than 1.2% total flow through the four holes, 16% variation for $AlCl_3$ and 8.4% for $MgCl_2$. Accordingly, the apparatus showed good mixing.

EXAMPLE 3

Retort pressures for $AlCl_3$ and $MgCl_2$ were 25 Torr. The retort temperature for $AlCl_3$ was 600° C. and the retort temperature for $MgCl_2$ was 875° C. Spinel deposition was prepared using a cross-jet deposition chamber having a configuration as shown in FIG. 6. Mandrels composed the walls of the deposition chamber. A total flow of 2.47 slpm including $AlCl_3$=0.04 slpm, HCl=0.04 slpm, $H_2$=2.39 slpm was passed through the right injector in the manifold having a configuration as shown in FIG. 2. A total flow of 0.28 slpm including $MgCl_2$=0.05 slpm and $N_2$=0.23 slpm was passed through the left injector in the confinement chamber of the manifold. Both chloride streams mixed thoroughly in the confinement chamber by convective mixing to form a substantially uniform mixture and then were dispersed through 8 side holes with internal diameters of 0.23 cm. Carbon dioxide with a flow of 1.1 slpm was passed through the central injector having a configuration as shown in FIG. 4 and then dispersed through 8 radial injector holes, each with an internal diameter of 0.23 cm. The deposition was performed for 12 hours at a mandrel temperature of 1200° C. and a furnace pressure of 25 Torr. Carbon dioxide mixed with the chlorides and $H_2$ in the cross-jet configuration and produced solid deposits on the mandrels and baffle. The maximum deposition rate was 1.4 micron/min. A deposit 1.03 mm thick was produced on the baffle. The thickness of the deposit on the mandrels was thinner than on the baffle.

EXAMPLE 4

Spinel deposition was performed using a parallel plate deposition chamber with a distance of 0.95 cm between the top and bottom parallel plates. The plates functioned as mandrels and were composed of graphite. The pressure in each retort was 50 Torr. The temperature of the $AlCl_3$ retort was 600° C. and the temperature of the retort for the $MgCl_2$ was 950° C. A total flow of 2.48 slpm including $AlCl_3$=0.04 slpm, HCl=0.05 slpm, $H_2$=2.39 slpm was passed through the right injector in the manifold having a configuration as shown in FIG. 2. A total flow of 0.25 slpm including $MgCl_2$=0.05 slpm and $N_2$=0.20 slpm was passed through the left injector in the manifold. Both chlorides mixed thoroughly in the manifold by convective mixing to form a substantially uniform mixture then dispersed through the bottom 9 holes in the parallel plate deposition chamber. Carbon dioxide with a flow of 2.33 slpm was passed through the central injector and then dispersed through the 9 plenum holes into the parallel plate deposition chamber. The taper in the plenum holes was 11 degrees. To prevent clogging of the carbon dioxide holes and the manifold inlet holes, an inlet baffle was used to separate the two flows. The angle of the baffle with the top parallel plate was 10 degrees. The deposition was performed for 12 hours at a mandrel temperature of 1188° C. and a furnace pressure of 50 Torr. The furnace was a resistively heated horizontal tube furnace. Downstream of the inlet baffle the flow of carbon dioxide mixed with the chlorides and $H_2$ and produced spinel on the walls of the parallel plate deposition chamber. No clogging of the plenum dispersion holes or the manifold inlet holes was observed. Solid deposit was produced on the top and bottom parallel plates. No powder was observed in the deposition chamber.

The water mole fraction along the axial center plane of the parallel plate deposition chamber was calculated. The results showed no water formation until after the inlet baffle. The values were calculated using ANSYS FLUENT 13 computational fluid dynamics software program. Since water is a required intermediate in spinel formation, the lack of water before the inlet baffle also explained why the inlet holes did not clog. The results showed that the inlet baffle was successful in preventing the clogging of the inlet holes and the parallel plate configuration succeeded in preventing powder formation that can interfere with solid deposition on the mandrels. By measuring the thickness of the deposit, the deposition rate was calculated to be in the range of 0.04-0.06 micron/min. The average thickness of the deposit was divided by the deposition time to calculate the deposition rate. At this rate a 42 hour deposit provided material>0.1 mm thick on the parallel plates of the deposition chamber.

EXAMPLE 5

Another spinel deposition was performed using the same apparatus as in Example 4 with a distance of 0.95 cm between the top and bottom parallel plates. A total flow of 4.95 slpm including $AlCl_3$=0.08 slpm, HCl=0.09 slpm, $H_2$=4.78 slpm was passed through the right injector in the manifold of FIG.

2. A total flow of 0.54 slpm including $MgCl_2$=0.14 slpm and $N_2$=0.40 slpm was passed through the left injector in the manifold. Both these chloride flows mixed thoroughly in the manifold chamber and then dispersed through the bottom 9 holes in the parallel plate deposition chamber. Carbon dioxide with a flow of 4.66 slpm was passed through the central injector and then dispersed through the 9 plenum holes into the parallel plate deposition chamber. To prevent clogging of the carbon dioxide holes and the manifold inlet holes, an inlet baffle was used to separate the two flows as in Example 4. The deposition was performed for 6.3 hours at a mandrel temperature of 1188° C. and a furnace pressure of 100 Torr. Downstream of the inlet baffle the carbon dioxide mixed well with metal chlorides and $H_2$ and produced spinel on the walls of the parallel plate deposition chamber. No clogging of the plenum dispersion holes or the manifold inlet holes was observed. Solid deposit was produced on the top and bottom parallel plates. No powder was observed in the deposition chamber. By measuring the thickness of the deposit, the deposition rate was calculated to be in the range of 0.10-0.13 micron/min. At this rate a 17 hour deposit provided material>0.1 mm thick in the deposition chamber.

EXAMPLE 6

Zinc sulfo-selenide is produced by mixing hydrogen sulfide, hydrogen selenide and argon in a manifold having a configuration as shown in FIG. 2. The assembly is as shown in FIG. 6. The flow rate for hydrogen sulfide is 0.3 slpm and for hydrogen selenide it is 0.3 slpm. Elemental zinc is heated in a retort to form molten elemental zinc. Molten zinc has a flow rate of 0.7 slpm. Argon gas is used as a carrier gas for the molten elemental zinc. The reactant flows were simulated using ANSYS FLUENT 13 computational fluid dynamics software program. The elemental zinc vapors and argon carrier gas pass through the central injector to impinge on the substantially uniform mixture of the hydrogen sulfide and hydrogen selenide in the deposition chamber. Inside the deposition chamber, the hydrogen sulfide, hydrogen selenide stream mixes with gaseous elemental zinc to form a substantially uniform mixture. Furnace pressure is 30 Torr and deposition temperature is 700° C. Zinc sulfo-selenide is expected to deposit on the walls of the deposition chamber having a thickness of at least 0.1 mm No powder formation is expected to be observed.

EXAMPLE 7

Cadmium and zinc metals are heated in a furnace to produce vapors which are transported using hydrogen as a carrier gas. Each vaporous metal passes into a manifold through separate inlet injectors. Zinc flow rate is 50 cc/min., cadmium flow rate is 100 cc/min. and hydrogen gas is 2000 cc/min. The reactant flows were simulated using ANSYS FLUENT 13 computational fluid dynamics software program. The manifold which is connected to the deposition chamber is inside the furnace. These metals are then substantially uniformly mixed in the manifold having a configuration as shown in FIG. 1. The substantially uniform mixture of metals is injected into the deposition chamber through multiple injector holes in the dispersion plate. Diethyltelluride is introduced into the deposition chamber using a water cooled central injector at a flow rate 100 cc/min and at a temperature of 22° C. The mixture of metals impinges on the diethyltelluride at a cross-jet configuration after entering the deposition chamber to form a substantially uniform mixture. Homogenous cadmium zinc telluride is expected to deposit on the walls of the deposition chamber. The thickness of the cadmium zinc telluride is expected to be at least 0.1 mm No powder is expected to be observed in the deposition chamber.

What is claimed is:

1. An apparatus comprising:
A manifold comprising a mixing chamber, the mixing chamber comprises a plurality of inlet injectors, each inlet injector comprises a bore opening into the mixing chamber for the introduction of gases into the mixing chamber, the bores of the plurality of inlet injectors are angled to allow the gases entering into the mixing chamber to impinge on each other in the mixing chamber;
A dispersion plate covers a side of the mixing chamber, the dispersion plate comprises a plurality of holes for egress of a substantially uniform mixture of gases from the mixing chamber; and
A cross-jet component joined to the manifold, the cross-jet component comprises a plurality of holes for the egress of additional gases from the cross-jet component, each hole of the cross-jet component corresponds to a hole in the dispersion plate to allow the substantially uniform mixture of gases from the mixing chamber of the manifold to impinge on the additional gases from the cross-jet component.

2. The apparatus of claim 1, wherein the manifold further comprises a confinement chamber defined by two plates each having four side and two faces, the plates join at a common side and a top side of each plate joins a top of the manifold and a back side of each plate joins a backside of the manifold, each face of each plate comprises a hole for insertion of an inlet injector.

3. The apparatus of claim 1, further comprising a dispersion chamber, the dispersion chamber comprises a first end and a second end, the manifold is joined to the dispersion chamber at the first end and a baffle is joined to the dispersion chamber at the second end.

4. The apparatus of claim 1, further comprising a top parallel plate and a bottom parallel plate to form a deposition chamber, The top plate and the bottom plate have a first end and a second end, the first end of the bottom parallel plate joins the manifold below a horizontal plane of the plurality of holes of the dispersion plate to allow the holes of the dispersion plate to open into the deposition chamber to allow the substantially uniform mixture of gases to pass into the deposition chamber parallel to the top and bottom parallel plates, the first end of the top parallel plate joins the cross-jet component, the cross-jet component comprises a plenum, the plenum comprises a floor comprising the plurality of holes of the cross-jet component, the plurality of holes of the cross-jet component are directed into the deposition chamber to allow the additional gases to pass into the deposition chamber perpendicular to the top and bottom parallel plates.

5. The apparatus of claim 4, further comprising a baffle, the baffle is secured in the deposition chamber at angle $\theta_3$ to the top parallel plate and proximal to the first end of the top parallel plate to allow additional gases from the plenum to impinge on the baffle.

6. The apparatus of claim 1, wherein the plurality of holes of the dispersion plate have the same diameters.

7. A method comprising:
a) providing a plurality of gases;
b) jetting the plurality of gases into a mixing chamber where they impinge on each other to allow the gases to form a substantially uniform mixture;
c) impinging the substantially uniform mixture of gases from the mixing chamber with additional gases from a cross-jet component in the deposition chamber to form a second substantially uniform mixture of gases; and d) reacting the second substantially uniform mixture of gases to deposit a compound.

8. The method of claim 7, wherein the compound is spinel, zinc sulfo-selenide or cadmium zinc telluride.

* * * * *